United States Patent
Okada et al.

(10) Patent No.: US 9,298,096 B2
(45) Date of Patent: Mar. 29, 2016

(54) CURABLE RESIN COMPOSITION, CURED PRODUCT THEREOF, PRINTED CIRCUIT BOARD COMPRISING THE SAME, AND METHOD FOR PRODUCING THE CURED PRODUCT

(71) Applicant: TAIYO INK MFG. CO., LTD., Hiki-gun (JP)

(72) Inventors: Kazuya Okada, Higashimatsuyama (JP); Shuichi Yamamoto, Suzhou (JP); Shoji Minegishi, Hiki-gun (JP); Daichi Okamoto, Higashimatsuyama (JP); Xiaozhu Wei, Kawagoe (JP)

(73) Assignee: Taiyo Ink Mfg. Co., Ltd., Hiki-gun (JP)

( * ) Notice: Subject to any disclaimer, the term of this patent is extended or adjusted under 35 U.S.C. 154(b) by 78 days.

(21) Appl. No.: 14/324,358

(22) Filed: Jul. 7, 2014

(65) Prior Publication Data

US 2015/0010735 A1   Jan. 8, 2015

(30) Foreign Application Priority Data

Jul. 4, 2013   (JP) .................................. 2013-140354
Dec. 19, 2013  (JP) .................................. 2013-262199

(51) Int. Cl.
*B32B 3/02* (2006.01)
*G03F 7/40* (2006.01)
*G03F 7/038* (2006.01)
*H05K 1/03* (2006.01)

(52) U.S. Cl.
CPC *G03F 7/40* (2013.01); *G03F 7/038* (2013.01); *H05K 1/03* (2013.01); *Y10T 428/24802* (2015.01)

(58) Field of Classification Search
CPC ... Y10T 428/24802; G03F 7/40; C08G 59/32; C08G 59/40
See application file for complete search history.

(56) References Cited

U.S. PATENT DOCUMENTS

| | | | | |
|---|---|---|---|---|
| 8,758,977 B2 * | 6/2014 | Minegishi | ............. | G03F 7/0226 430/18 |
| 8,871,422 B2 * | 10/2014 | Minegishi | ............. | G03F 7/0226 430/18 |
| 8,907,049 B2 * | 12/2014 | Baidak | .................. | C08G 81/00 523/400 |
| 2013/0341304 A1 * | 12/2013 | Minegishi | ............. | C08F 220/18 216/47 |
| 2014/0034371 A1 * | 2/2014 | Endo | ..................... | G03F 7/2016 174/258 |
| 2014/0220783 A1 * | 8/2014 | Koumura | ................ | G03F 7/094 438/703 |

FOREIGN PATENT DOCUMENTS

WO   2012/073242 A1   6/2012

* cited by examiner

*Primary Examiner* — Elizabeth Mulvaney
(74) *Attorney, Agent, or Firm* — Oblon, McClelland, Maier & Neustadt, L.L.P.

(57) ABSTRACT

An alkaline development-type curable resin composition having an excellent strength against tearing, breaking, distortion and torsion, and excellent toughness, a cured product of the curable resin composition, a printed circuit board having the cured product, and a process for manufacturing the cured product are disclosed. A curable resin composition is obtained, which contains (A) a thermoplastic resin, (B) a thermosetting component, (C) an alkali-soluble component, and at least one of (D-1) a photopolymerization initiator and (D-2) a photo-base generator, the thermoplastic resin (A) having two or more glass transition points including two glass transition points Tgx and Tgy, which satisfy Tgx>30° C. and Tgy<0° C. and the thermosetting component (B) having a glass transition point Tgz, which satisfies Tgz≥Tgy+20° C. Moreover, a cured product of the curable resin composition, a printed circuit board having the cured product, and a process for manufacturing the cured product are obtained.

13 Claims, 3 Drawing Sheets

CURABLE RESIN COMPOSITION, CURED PRODUCT THEREOF, PRINTED CIRCUIT BOARD COMPRISING THE SAME, AND METHOD FOR PRODUCING THE CURED PRODUCT

CROSS REFERENCE TO RELATED APPLICATIONS AND INCORPORATION BY REFERENCE

This application is based upon and claims the benefit of priority from the prior Japanese Patent Application No. 2013-262199, filed on Dec. 19, 2013; the entire content of which is incorporated herein by reference.

BACKGROUND OF THE INVENTION

1. Field of the Invention

The present invention relates to a curable resin composition, particularly a curable resin composition preferably used as a resist such as a solder resist.

The present invention further relates to a cured product of the curable resin composition, a printed circuit board comprising the same, and a method for producing the cured product.

2. Discussion of the Related Art

At present, liquid development-type photosolder resists are used as solder resists for a printed circuit board for consumer use and a printed circuit board for industrial use. The above-mentioned photosolder resists are developed, after ultraviolet irradiation, to form an image, which is then subjected to finish curing (main curing) by at least one of heat application and photoirradiation. Such photosolder resists are used with the viewpoints of high precision and high density taken into account. Moreover, it is requested to provide solder resists having improved workability and performance, in order to increase the density of printed circuit boards, accompanying reduction in the size and weight of electronic equipment.

Among such liquid development-type solder resists, an alkali development-type solder resist using a dilute aqueous alkaline solution as a developer is in the mainstream in consideration of environmental problems, which is used in large quantities in the production of printed circuit boards. As such alkali development-type photo solder resist, a resin obtained by modifying an epoxy resin with an acrylate (epoxy acrylate-modified resin) is commonly used.

For example, WO2012/73242 has proposed a curable resin composition which provides a resist (cured product) excellent in thermal shock resistance, PCT resistance, HAST resistance, electroless gold plating resistance, and the like.

BRIEF SUMMARY OF THE INVENTION

WO2012/73242 has proposed a resin composition which provides a resist having various types of improved resistance under conditions for use. However, it is still possible to further improve the physical strength and toughness of the cured product.

Thus, an object of the present invention is to provide an alkali development-type curable resin composition which will provide a cured product having excellent strength against tearing, breaking, distortion, and torsion, and toughness, a cured product obtained therefrom, a printed circuit board comprising the cured product, and a method for producing the cured product.

As a result of intensive studies, the inventors of the present invention have found that the above discussed object can be achieved by the invention as follows. Thus. the present invention has been completed.

Namely, the curable resin composition of the present invention comprises a thermoplastic resin (A), a thermosetting component (B), an alkali-soluble component (C), and at least one of a photopolymerization initiator (D-1) and a photo-base generator (D-2), the thermoplastic resin (A) having two or more glass transition points $Tg_x$ and $Tg_y$, which satisfy $Tg_x > 30°$ C. and $Tg_y < 0°$ C.; and the thermosetting component (B) having a glass transition point $Tg_z$, which satisfies $Tg_z \geq Tg_y + 20°$ C.

According to the present invention, an alkaline development-type curable resin composition is obtained, which has an excellent strength after being cured.

The curable resin composition of the present invention will preferably have a nanocylinder structure inside, after being cured.

Here, the nanocylinder structure means a nano-sized co-continuous phase structure. The nanocylinder structure can preferably be prepared under curing the composition under a curing condition at a temperature of 140 to 160° C. and a time of 30 to 90 minutes.

The cured product internally having a nanocylinder structure has effects of excellent toughness and stress relaxation.

Alternatively, when the nanocylinder structure is not formed, the inside of the cured product will show a macrophase separated structure or a uniform structure. Here, the macrophase separated structure means a micron-sized co-continuous phase structure, and the uniform structure means a structure without phase separation. In the former case, reduction in toughness would occur. On the other hand, in the latter case, cracks and reduction in toughness could be seen.

The thermosetting component (B) used in the present invention is preferably an epoxy compound.

Moreover, the alkali-soluble component (C) is preferably a carboxyl group-containing resin or a phenolic hydroxy group-containing resin.

It is preferable that the curable resin composition of the present invention further comprises a heat-curing catalyst (E).

Accordingly, the heat curing of the curable resin composition is accelerated, and a tough resist is formed.

Thus, the curable resin composition of the present invention forms a cured product by photoirradiation, heating, or both, and is used as a resist for a printed circuit board.

The cured product of the present invention is obtained by photoirradiation followed by curing the curable resin composition.

The cured product of the present invention preferably has a nanocylinder structure.

The printed circuit board of the present invention comprises the cured product.

The method for producing a cured product of the present invention comprises: a step (a) of coating a substrate with the curable resin composition according to the present invention and drying the curable resin composition; a step (a) of applying a curable resin composition to a substrate, a step (b) of applying a pattern-wise light to the curable resin composition to activate a photopolymerization initiator to cure the photo-irradiated part, and a step (c) of removing the non-irradiated part by development to form a negative-type patterned layer, and optionally a step (d) of further light application.

BRIEF DESCRIPTION OF THE DRAWINGS

A more complete appreciation of the invention and many of the attendant advantages thereof will be readily perceived as the same becomes better understood by reference to the following detailed description when considered in connection with the accompanying drawings, wherein.

DETAILED DESCRIPTION OF THE INVENTION

Other features of this invention will become apparent in the course of the following description of exemplary embodiments, which are given for illustration of the invention and are not intended to be limiting thereof.

The curable resin composition of the present invention is characterized by comprising a thermoplastic resin (A), a thermosetting component (B), an alkali-soluble component (C), at least one of a photopolymerization initiator (D-1) and a photo-base generator (D-2), the thermoplastic resin (A) having two or more glass transition points $Tg_x$ and $Tg_y$, which satisfy $Tg_x > 30°$ C. and $Tg_y < 0°$ C., and the glass transition point of the thermosetting component (B) $Tg_z \geq Tg_y + 20°$ C.

Since the curable resin composition of the present invention contains a thermoplastic resin (A) having two or more glass transition points wherein $Tg_x > 30°$ C. and $Tg_y < 0°$ C., and a thermosetting component (B) having a glass transition point $Tg_z \geq Tg_y + 20°$ C. Based on the structure, a portion (soft segment described later) of the resin composition, which contributes to express $Tg_y$ in the thermoplastic resin (A) is immiscible in the resin composition.

In the present invention, a resin composition is applied to a substrate, and, as described later, generation of bases on the surface of the composition, i.e., activation of either one of a photopolymerization initiator (D-1) and a photo-base generator (D-2), and curing the composition can be carried out by photoirradiation.

In the stage where curing of the resin composition of the present invention proceeds, phase separation of individual components or segments proceeds, a coating film having a sea-island pattern all over is to be formed. More specifically, island portions are formed from a soft segment in the resin composition, with respect to a sea portion/portions prepared from the resin composition except the soft segment. The structures of island portions of the sea-island structure vary depending upon the substrate preparation conditions such as formulation and curing conditions. When optimum conditions are used, the island portions will have a nanosize cylinder structure, providing toughness and a stress relaxation effect. In contrast, under improper conditions, island portions are formed of micron-size spherical structures, reducing toughness.

In order for the cured product of the resin composition to maintain mechanically tough properties (to have high toughness), not only strength but also elasticity, which prevents stress from being increased, must be taken into consideration. On the other hand, a cured product of the resin composition, in reality, has minute defective parts such as wounds, voids and cracks, which are produced during manufacturing and curing processes. When a predetermined stress is externally applied to such defective parts, the stress is usually augmented or transmitted from the defective parts to develop the cracks.

In contrast, the resin composition of the present invention having the aforementioned sea-island structure is cured to exhibit a predetermined elasticity in its entirety. Therefore, the cured composition possesses an improved toughness.

Thus, according to the resin composition of the present invention, a resist can be obtained, which rarely has cracks and can sufficiently protect a substrate (an object to be protected), is formed.

Components constituting the curable resin composition of the present invention will now be explained more in detail.

[Component (A); Thermoplastic Resin]

In the present invention, a thermoplastic resin having a plurality of glass transition points, particularly, two glass transition points ($Tg_x$ and $Tg_y$), is used as component (A).

Examples of the thermoplastic resin having two glass transition points include a block copolymer containing a structure represented by the following formula (I):

$$X-Y \qquad (I)$$

(where X represents a polymer unit (hard segment) having a glass transition point $Tg_x > 30°$ C.; and Y represents a polymer unit (soft segment) having a glass transition point $Tg_y < 0°$ C.). The block copolymer herein generally refers to a copolymer having a long chain molecular structure, which is formed by connecting two or more types of polymers having different properties from one another via a covalent bond. By use of the block copolymer, the cured product obtained from the curable resin composition of the present invention has further improved toughness.

In the above, glass transition points Tg are measured by differential scanning calorimetry (DSC).

As the block copolymers containing a structure represented by formula (I), a block copolymer is preferably used wherein X is a polymer unit having a glass transition point $Tg_x > 30°$ C. and Y is a polymer unit having a glass transition point $Tg_y < 0°$ C.

Particularly, $-50°$ C. $< Tg_y < 0°$ C. and $30°$ C. $< Tg_x < 150°$ C. are preferred. In addition, $Tg_y$ has the following relationship with a glass transition point $Tg_z$ of a thermosetting component (described later): $Tg_z \geq Tg_y + 20°$ C. As the temperature of $Tg_z$ increases more, the toughness of the cured product is extremely improved.

As the block copolymers containing a structure represented by formula (I), it is preferable to use a block copolymer in which X has a high compatibility with an alkali-soluble component (component (C)) described later and Y has a low compatibility with the alkali-soluble component (component (C)). Accordingly, a cured composition having a desired toughness can be obtained.

Preferable examples of X in the formula (I) are ($C_1$-$C_3$ alkyl) methacrylate such as poly(methyl methacrylate) (PMMA ($Tg_x$: 140° C.)), and polystyrene (PS) ($Tg_x$: 100° C.). Further, Preferable examples of Y are poly ($C_1$-$C_6$ alkyl) acrylate such as poly(n-butyl acrylate) (PBA) ($Tg_y$: −40° C.) and a $C_4$-$C_6$ diene such as polybutadiene (PB) ($Tg_y$: −70° C.).

As the block copolymer for use in the present invention, at least ternary block copolymer is preferred. In particular, a block copolymer, which is synthesized by living polymerization method to have accurately controlled molecular structure, is preferably used for obtaining the effects of the present invention. This would be because the block copolymer synthesized by a living polymerization method has a narrow molecular weight distribution, and thus, characteristics of individual units are made clearly distinguished. The molecular weight distribution of the block copolymer to be used is preferably 2.5 or less and further preferably 2.0 or less.

Among them, a block copolymer represented by the following formula (II) is preferably used:

$$X_1—Y—X_2 \quad (II)$$

In the formula, $X_1$ and $X_2$ are polymer units (hard segments) of a glass transition point $Tg_{x1}>30°$ C. and a glass transition point $Tg_{x2}>30°$ C., respectively; and Y is a polymer unit (soft segment) of a glass transition point $Tg_y<0°$ C.; $X_1$ and $X_2$ may be different polymer units from each other, but preferably the same polymer units with each other.

Processes for manufacturing a block copolymer are described, for example, in JP-A (Kohyo) 2005-515281 and JP-A (Kohyo) 2007-516326.

(Examples of X—Y Type (Alkema D52 Etc.))

Examples of the commercially available products of a block copolymer applicable to the present invention are commercially available products of at least a ternary block polymer such as acrylic triblock copolymers manufactured by Arkema K.K. by using living polymerization. Specific examples include an SBM type represented by a polystyrene ($Tg_{x1}$: 100° C.)—polybutadiene ($Tg_y$: −70° C.)—poly(methyl methacrylate) ($Tg_{x2}$: 140° C.); a MAM type represented by poly(methyl methacrylate) ($Tg_{x1}$: 140° C.)—poly(n-butyl acrylate) ($Tg_y$: −40° C.)—poly(methyl methacrylate) ($Tg_{x2}$: 140° C.); and a MAM N type and a MAM A type, which are modified with a carboxylic acid and a hydrophilic group, respectively. Examples of the SBM type include E41, E40, E21 and E20. Examples of the MAM type include M51, M52, M53, M22 and SM6290XD30. Examples of the MAM N type include 52N and 22N. Examples of the MAM A type include SM4032XM10.

Besides above, a block copolymer derived from methyl methacrylate and butyl acrylate, such as KURARITY, manufactured by Kuraray Co., Ltd., can be used. Examples of the commercially available product thereof include LA1114, LA2250, LA2140e and LA2330.

The weight average molecular weight of a block copolymer is generally 10,000 to 400,000, and preferably within the range of 30,000 to 300,000. When the weight average molecular weight is less than 20,000, a desired effects such as toughness and flexibility cannot be obtained and the tack property is also insufficient.

In contrast, when the weight average molecular weight exceeds 400,000, the viscosity of the curable resin composition increases, and printability and developability significantly deteriorate.

The content of the above block copolymer, based on an alkali-soluble component (100 parts by weight) preferably falls within the range of 1 to 50 parts by weight, and more preferably 5 to 35 parts by weight. When the content is less than 1 part by weight, the effect of the block copolymer is not expected. In contrast, the content is 50 parts by weight or more is not preferable since the developability and application properties of the curable resin composition may probably deteriorate.

In the present invention, it becomes possible to impart an excellent toughness to a cured product obtained from the curable resin composition of the present invention, by using a thermoplastic resin (component A) having two glass transition points represented by $Tg_x$ and $Tg_y$, particularly using a block copolymer containing a structure represented by the above formula (I). The cured product of the present invention maintains toughness as a resist by containing the thermoplastic resin (component (A)) even in a step of patterning the cured product as a resist by development or during the use as a resist. Accordingly, the cured product of the present invention satisfactorily protects the substrate without generation or progress of a crack even under alkali development and in a severe application/use condition as a solder resist.

In particular, a resist having excellent toughness can be obtained by performing the curing treatment of the composition at the glass transition point Tg or more of the hard segment.

[Component (B): Thermosetting Component]

As a component (B), a thermosetting component having a glass transition point $Tg_x$ is used. By including the component (B), properties such as heat resistance and insulation reliability can be improved. In the present invention, it is necessary that the glass transition point $Tg_z$ of the thermosetting component (B) and the glass transition point $Tg_y$ of the thermoplastic resin (component (A)) (Tgy is a glass transition point lower than the other among two glass transition points of the component (A)) satisfy the relationship represented by the following formula:

$$Tg_z \geq Tg_y + 20° C.$$

The glass transition point Tgz of the thermosetting component (B) of the present invention, as well as glass transition points $Tg_x$ and $Tg_y$ of the thermoplastic resin (A), can be measured by a differential scanning calorimeter (DSC) in accordance with the known manner in the art.

The glass transition point $Tg_y$ of the soft segment of the thermoplastic resin (A) has a relationship with respect to the glass transition point $Tg_z$ of the thermosetting component (B), i.e., $Tg_z \geq Tg_y + 20°$ C. As the temperature of $Tg_z$ increases more and more, the toughness of the cured product is extremely improved. With the reason, the compatibility of the soft segment of a thermoplastic resin (A) and the thermosetting component (B) is related. Namely, the greater the difference between the glass transition point $Tg_y$ of the soft segment of a thermoplastic resin (A) and the glass transition point $Tg_z$ of the thermosetting component (B), the smaller the compatibility between the soft segment of a thermoplastic resin (A) and the thermosetting component (B), to increase the tendency of phase separation. More preferably, the glass transition point $Tg_z$ of the thermosetting component (B) satisfies $Tg_z \geq Tg_y + 30°$ C.

As the thermosetting component (B), an epoxy compound or a polyfunctional oxetane compound is preferably used. Among them, an epoxy resin is more preferable.

As the epoxy compound, liquid state, crystalline/low molecular weight, semisolid and solid materials can be used. More specifically, the epoxy resin is a resin having an epoxy group. Any epoxy resin known in the art can be used. For example, polyfunctional epoxy resins having two or more epoxy groups in a molecule can be used. Hydrogenated bifunctional epoxy compounds may also be used.

Examples of the polyfunctional epoxy compound include a bisphenol A epoxy resin, a brominated epoxy resin, a novolak epoxy resin, a bisphenol F epoxy resin, a hydrogenated bisphenol A epoxy resin, a glycidylamine epoxy resin, a hydantoin epoxy resin, an alicyclic epoxy resin, a trihydroxyphenylmethane epoxy resin, a bixylenol or biphenol epoxy resin or mixtures of these, a bisphenol S epoxy resin, a bisphenol A novolak epoxy resin, a tetraphenylol ethane epoxy resin, a heterocyclic epoxy resin, a diglycidyl phthalate resin, a tetra glycidyl xylenoyl ethane resin, a naphthalene group-containing epoxy resin, an epoxy resin having a dicyclopentadiene skeleton, a glycidyl methacrylate copolymer epoxy resin, cyclohexylmaleimide/glycidyl methacrylate copolymer epoxy resin and a CTBN-modified epoxy resin.

Further, examples of a liquid-state bifunctional epoxy resin include alicyclic epoxy resins such as vinylcyclohexene diepoxide, (3',4' epoxycyclohexylmethyl)-3,4-epoxycyclohexane carboxylate, (3',4'-epoxy-6'-methylcyclohexylmethyl)-3,4-epoxy-6-methylcyclohexane carboxylate.

As the epoxy compound, commercially available products can be also used. Examples thereof that can be used include HP4032 (naphthalene type bifunctional epoxy resin manufactured by DIC, Tg: −5° C.); NC3000H and NC3000L (biphenyl type epoxy compounds manufactured by Nippon Kayaku Co., Ltd., Tg: 20° C. and 30° C., respectively); EPPN501H (triphenylglycidylether type epoxy resin manufactured by Nippon Kayaku Co., Ltd., Tg: 20° C.); jER828, jER834 and jER1001 (liquid state, semisolid and solid bisphenol A epoxy resins, respectively, manufactured by Mitsubishi Chemical Corporation, Tg: −20° C., 0° C. and 30° C., respectively); DEN 431 and DEN438 (epoxy novolak resins manufactured by Dow Chemical, Tg: −10° C. and 0° C., respectively); P201 (phenol novolak type epoxy resin manufactured by Nippon Kayaku Co., Ltd. Tg: 5° C.); and N870 (modified novolak resin manufactured by DIC, Tg: 20° C.).

As the above polyfunctional oxetane compound, polyfunctional oxetanes such as bis[(3-methyl-3-oxetanylmethoxy) methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl) methyl acrylate, (3-methyl-3-oxetanyl) methyl methacrylate, (3-ethyl-3-oxetanyl) methyl methacrylate and oligomers or copolymers of these can be used. In addition to the above, ether compounds obtained from oxetane alcohol and a resin having a hydroxy group such as novolak resin, poly(p-hydroxystyrene), cardo type bisphenols, calixarenes, calixresorcinarenes or silsesquioxane can be used. Moreover, copolymers obtained from an oxetane ring-containing unsaturated monomer and an alkyl (meth)acrylate or the like can be used.

Herein, thermosetting components having benzene skeleton is preferable since heat resistance of the composition improves. Furthermore, in the case where the curable resin composition contains a white pigment, the thermosetting components having an alicyclic skeleton is preferably used. Accordingly, the photoreactivity of the composition improves.

The mixing ratio, i.e., equivalent ratio between the above thermosetting components and the alkali-soluble component (alkali-soluble component:heat reactive compound) is preferably 1:0.5 to 1:10. When the equivalent ratio is outside the above mentioned range, development becomes difficult in some cases. The equivalent ratio is further preferably in the range of 1:0.5 to 1:5.

The thermosetting components (B) may be used alone or in combination with two or more.

The mixing ratio, i.e., equivalent ratio between the thermosetting component (B) and the alkali-soluble component (C) (described later)(alkali-soluble component:thermosetting component) is preferably 1:0.5 to 1:10. When the equivalent ratio is outside the above mentioned range, development becomes difficult in some cases. The equivalent ratio is further preferably in the range of 1:0.5 to 1:5.

[Component (C): Alkali-Soluble Component]

In the present invention, an alkali-soluble component is used as a component (C). As the alkali-soluble component, a carboxyl group-containing resin or a phenolic hydroxy group-containing resin is preferably used. Accordingly, it becomes possible for the coating film prepared from a curable resin composition to be formed in a predetermined pattern (pattern formation) through development.

As the carboxyl group-containing resin, various types of carboxyl group-containing resins known in the art can be used as long as a carboxyl group is contained in the molecule. The carboxyl group-containing resin is used for imparting alkali development property to the composition. Particularly when the curable resin composition is a curable resin composition having photosensitivity, a carboxyl group-containing photosensitive resin having an ethylenically unsaturated double bond in the molecule is preferably used in view of curing property and development resistance. The unsaturated double bond is preferably derived from an acrylic acid or methacrylic acid or a derivative of these.

When a carboxyl group-containing resin having no ethylenically unsaturated double bond is used alone, it is preferable to also add a photopolymerizable monomer to the composition, in order to carry out a sequential reaction of compound having an ethylenically unsaturated double bond via photopolymerization initiator. As the photopolymerizable monomer, a photosensitive compound of the present invention, the oligomer of the compound, or a compound having two or more ethylenically unsaturated groups in a molecule, which will be described later, may be used.

As specific examples of the carboxyl group-containing resin, the compounds (either an oligomer or a polymer) as mentioned below are preferable.

(1) A carboxyl group-containing resin obtained by copolymerization between an unsaturated carboxylic acid such as (meth)acrylic acid and an unsaturated group-containing compound such as styrene, α-methylstyrene, $C_1$-$C_6$ alkyl (meth)acrylate or isobutylene.

(2) A carboxyl group-containing urethane resin obtained by a polyaddition reaction of a diisocyanate such as an aliphatic diisocyanate, a branched aliphatic diisocyanate, an alicyclic diisocyanate and an aromatic diisocyanate with a carboxyl group-containing dialcohol compound such as dimethylol propionic acid and dimethylol butanoic acid, and a polycarbonate polyol, a polyether polyol, a polyester polyol, a polyolefin polyol, an acrylic polyol, and diol compound such as a bisphenol A alkylene oxide added diol and a compound having a phenolic hydroxyl group and an alcoholic hydroxyl group.

(3) A terminal carboxyl group-containing urethane resin obtained by reacting a dibasic acid anhydride such as propionic anhydride, succinic anhydride, maleic anhydride and phthalic anhydride with respect to the terminal group(s) of an urethane resin obtained by a polyaddition reaction of a diisocyanate compound such as an aliphatic diisocyanate, a branched aliphatic diisocyanate, an alicyclic diisocyanate and an aromatic diisocyanate with a polycarbonate polyol, a polyether polyol, a polyester polyol, a polyolefin polyol, an acrylic polyol, a diol compound such as a bisphenol A alkylene oxide added diol, and a compound having a phenolic hydroxyl group and an alcoholic hydroxyl group.

(4) A carboxyl group-containing photosensitive urethane resin obtained by a polyaddition reaction of a diisocyanate; a (meth)acrylate or a partial acid anhydride-modified (meth)acrylate, (the modification being made with a dibasic acid anhydride such as propionic anhydride, succinic anhydride, maleic anhydride and phthalic anhydride) of a bifunctional epoxy resin such as bisphenol A epoxy resin, a hydrogenated bisphenol A-type epoxy resin, a bisphenol F-type epoxy resin, a bisphenol S-type epoxy resin, a bixylenol-type epoxy resin or a biphenol epoxy resin; a carboxyl group-containing dialcohol compound; and a diol compound.

(5) A carboxyl group-containing urethane resin having a terminal (meth)acrylate moiety, which is obtained by adding a compound having one hydroxy group and one or more (meth)acryloyl groups in a molecule such as a hydroxyalkyl (meth)acrylate during synthesis of the aforementioned resin (2) or (4).

(6) A carboxyl group-containing urethane resin having a terminal (meth)acrylate moiety, which is obtained by adding a compound having one isocyanate group and one or more (meth)acryloyl groups in a molecule, such as a equimolar reaction product between isophorone diisocyanate and pentaerythritol triacrylate, during synthesis of the aforementioned resin (2) or (4).

(7) A carboxyl group-containing photosensitive resin obtained by reacting a bifunctional or a polyfunctional (solid) epoxy resin (to be described later) with a (meth)acrylic acid to obtain a compound, and adding a dibasic acid anhydride such as phthalic anhydride, tetrahydrophthalic anhydride and hexahydro phthalic anhydride to the hydroxy groups at a side chain of the compound.

(8) A carboxyl group-containing photosensitive resin obtained by reacting a (meth)acrylic acid with a polyfunctional epoxy resin, which has been obtained by epoxylating hydroxy group(s) of a bifunctional (solid) epoxy resin (described later) with epichlorohydrin, to obtain a compound, and adding, to the resultant hydroxy groups of the compound, a dibasic acid anhydride such as phthalic anhydride, tetrahydrophthalic anhydride and hexahydrophthalic anhydride.

(9) A carboxyl group-containing photosensitive resin obtained by adding a cyclic ether such as ethylene oxide and a cyclic carbonate such as propylene carbonate to a polyfunctional phenol compound such as novolak to obtain a compound, partially esterifying the resultant hydroxy groups of the compound with a (meth)acrylic acid and reacting the remaining hydroxy groups thereof with a polybasic acid anhydride.

(10) Carboxyl group-containing photosensitive resins obtained by further adding a compound having one epoxy group and one or more (meth)acryloyl groups in a molecule such as glycidyl (meth)acrylate and α-methylglycidyl (meth) acrylate, to the aforementioned resins (1) to (9).

In the present application, "(meth)acrylates" collectively means acrylates, methacrylates and mixtures of these and the same applies to other analogous expressions.

As commercially available products of the above carboxyl group-containing resins, e.g., R-2000 (corresponding to the above resin (6) manufactured by DIC); PCR-1160H (manufactured by Nippon Kayaku Co., Ltd.); and VB5301 and VB5305 (these are manufactured by Mitsubishi Rayon Co., Ltd.) can be used.

The aforementioned carboxyl group-containing resins can be subjected to development with a dilute aqueous alkaline solution since the resins have a large number of free carboxyl groups in a side chain of the backbone polymer.

The acidic values of the carboxyl group-containing resins are preferably from 40 to 200 mgKOH/g. When the acidic value of a carboxyl group-containing resin is less than 40 mgKOH/g, it becomes difficult to perform development with an alkali. While when the acidic value exceeds 200 mgKOH/g, dissolution of a light exposed part by a developer proceeds. Because of this, a line becomes thinner more than required. In some cases, a light exposed part and a non-light exposed part are indistinguishably dissolved by a developer or removed, and it would become difficult to perform a normal resist patterning. More preferably, the acidic value is 45 to 120 mgKOH/g.

The weight average molecular weight of a carboxyl group-containing resin varies depending upon the resin skeleton. The weight average molecular weight is preferably in the range of 2,000 to 150,000. When the weight average molecular weight is less than 2,000, it is possible that the tack-free performance is lowered, the humidity resistance of a coating film after light exposure decreases, the thickness of the film is decreased during development, and that the resolution greatly deteriorates. In contrast, when the weight average molecular weight exceeds 150,000, developability sometimes extremely deteriorates, resulting in low storage stability. The weight average molecular weight is more preferably 5,000 to 100,000.

The content of such a carboxyl group-containing resin is preferably 20 to 60% by weight based on the total composition. When the content is less than 20% by weight, film strength may be decreased. In contrast, when the content is more than 60% by weight, the viscosity of the composition is increased and application properties etc. are decreased. The content is more preferably 30 to 50% by weight.

These carboxyl group-containing resins that can be used are not limited to those described in the specification. These resins can be used alone or as a mixture of plurality of types.

As the phenolic hydroxy group-containing resin, phenolic hydroxy group-containing resins having various skeletons may be used, which are synthesized by using a compound having a phenolic hydroxy group, such as a compound having a biphenyl skeleton or a phenylene skeleton, or both of these skeletons, or using a phenolic hydroxy group-containing compound, such as phenol, ortho-cresol, para-cresol, meta-cresol, 2,3-xylenol, 2,4-xylenol, 2,5-xylenol, 2,6-xylenol, 3,4-xylenol, 3,5-xylenol, catechol, resorcinol, hydroquinone, methylhydroquinone, 2,6-dimethylhydroquinone, trimethylhydroquinone, pyrogallol and phloroglucinol.

For example, common phenolic resins known in the art can be used, including a phenol novolak resin, an alkylphenol novolak resin, bisphenol A novolak resin, a dicyclopentadiene phenolic resin, Xylok phenolic resin, terpene-modified phenolic resin, polyvinyl phenols, bisphenol F, bisphenol S phenolic resin, poly-p-hydroxystyrene, condensates between naphthol and aldehydes, condensates between dihydroxynaphthalene and aldehydes.

These can be used alone or in combination with two or more.

As commercially available products of such phenolic hydroxy group-containing resins, HF1H60 (manufactured by MEIWA PLASTIC INDUSTRIES, LTD.); PHENOLITE TD-2090 and PHENOLITE TD-2131 (manufactured by Dai Nippon Printing Co., Ltd.); BESMOL CZ-256-A (manufactured by DIC); Shonol BRG-555 and Shonol BRG-556 (manufactured by SHOWA DENKO K. K.); CGR-951 (manufactured by Maruzen Petrochemical Co., Ltd.); or polyvinyl phenol CST70, CST90, S-1P and S-2P (manufactured by Maruzen Petrochemical Co., Ltd.), etc. can be used. These phenolic hydroxy group-containing resins can be used alone or in appropriate combination with two or more.

In the present invention, as a component (C), either one of a carboxyl group-containing resin and a phenolic hydroxy group-containing resin or a mixture of these may be used.

[at Least One of Component (D-1) Photopolymerization Initiator and (D-2) Photo-Base Generator]

As the photopolymerization initiator (D-1) to be used in the present invention, any one of the photopolymerization initiators known in the art can be used. Of them, an oxime ester photopolymerization initiator having an oxime ester group, an α-aminoacetophenone photopolymerization initiator, an acylphosphineoxide photopolymerization initiator and a titanocene photopolymerization initiator are preferred.

In addition to the above, photopolymerization initiators having a substituent such as an acyloxyimino group, a N-formylated aromatic amino group, a N-acylated aromatic amino group, a nitrobenzyl carbamate group and an alkoxybenzylcarbamate group can be used.

The photopolymerization initiators (D-1) may be used alone or in combination with two or more.

Examples of the oxime ester photopolymerization initiator that can be used include, 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(0-acetyloxime)-1-[9-ethyl-6-(2-methylbenzoyl)-9H-carbazol-3-yl]ethanone, 1-(0-acetyloxime)-1-[9-methyl-6-(2-methylbenzoyl)-9H-carbazol-3-yl]ethanone, 1-(0-acetyloxime)-1-[9-propyl-6-(2-methylbenzoyl)-9H-carbazol-3-yl]ethanone, 1-(0-acetyloxime)-1-[9-ethyl-6-(2-ethylbenzoyl)-9H-carbazol-3-yl]ethanone, 1-(0-acetyloxime)-1-[9-ethyl-6-(2-butylbenzoyl)-9H-carbazol-3-yl]ethanone, 2-(benzoyloxyimino)-1-[4-(phenylthio)phenyl]-1-octanone, and 2-(acetoxyimino)-4-(4-chlorophenylthio)-1-[9-ethyl-6-(2-methylbenzoyl)-9H-carbazol-3-yl]-1-butanone. As commercially available products, CGI-325, IRGACURE (Trademark) OXE01 and IRGACURE OXE02, manufactured by BASF JAPAN LTD. and N-1919 manufactured by ADEKA CORP., are used.

A photopolymerization initiator having two oxime ester groups in a molecule can also be appropriately used, and more specifically, an oxime ester compound having a carbazole structure represented by the following formula (I) can be used.

[Formula 1]

(I)

where X represents a hydrogen atom, an alkyl group having 1 to 17 carbon atoms, an alkoxy group having 1 to 8 carbon atoms, a phenyl group, a phenyl group (substituted with an alkyl group having 1 to 17 carbon atoms, an alkoxy group having 1 to 8 carbon atoms, an amino group, or an alkylamino group or dialkylamino group including an alkyl group having 1 to 8 carbon atoms), a naphthyl group (substituted with an alkyl group having 1 to 17 carbon atoms, an alkoxy group having 1 to 8 carbon atoms, an amino group, or an alkylamino group or dialkylamino group including an alkyl group having 1 to 8 carbon atoms; Y and Z each independently represent a hydrogen atom, an alkyl group having 1 to 17 carbon atoms, an alkoxy group having 1 to 8 carbon atoms, a halogen group, a phenyl group, a phenyl group (substituted with an alkyl group having 1 to 17 carbon atoms, an alkoxy group having 1 to 8 carbon atoms, an amino group, or an alkylamino group or dialkylamino group including an alkyl group having 1 to 8 carbon atoms), a naphthyl group (substituted with an alkyl group having 1 to 17 carbon atoms, an alkoxy group having 1 to 8 carbon atoms, an amino group, or an alkylamino group or dialkylamino group including an alkyl group having 1 to 8 carbon atoms), an anthryl group, a pyridyl group, a benzofuryl group and a benzothienyl group; Ar represents an alkylene having 1 to 10 carbon atoms, vinylene, phenylene, biphenylene, pyridylene, naphthylene, thiophene, anthrylene, thienylene, furylene, 2,5-pyrrol-diyl, 4,4'-stilben-diyl and 4,2'-styrene-diyl; and n is an integer of 0 or 1.

Particularly, an oxime ester photopolymerization initiator represented by the above formula where X and Y each represents a methyl group or an ethyl group; Z represents methyl or phenyl; n is 0; and Ar represents phenylene, naphthylene, thiophene or thienylene, is preferred.

The content of the oxime ester photopolymerization initiator to be used is preferably 0.01 to 10 parts by weight, based on the alkali-soluble component (100 parts by weight), and particularly preferably, 0.5 to 5 parts by weight. When the content falls within the range of 0.01 parts by weight or more and 10 parts by weight or less, the coating film is stably formed. At the same time, coating film properties such as chemical resistance can be maintained. In addition, the constant light absorption is maintained at the surface of the solder resist coating film. Further, an excellent deep-part curing property is obtained. In addition, the constant light absorption is maintained, and deep-part curing property is made excellent.

Specific examples of the α-aminoacetophenone photopolymerization initiator include 2-methyl-1-[4-(methylthio) phenyl]-2-morphorinopropanone-1,2-benzyl-2-dimethylamino-1-(4-morphorinophenyl)-butan-1-one, 2-dimethylamino)-2-[(4-methylphenyl)methyl]-1-[4-(4-morphorinynphenyl]-1-butanone and N,N-dimethylamino acetophenone. Examples of commercially available products of the above-mentioned initiator include IRGACURE 907, IRGACURE 369 and IRGACURE 379 manufactured by BASF JAPAN LTD.

Specific examples of the acylphosphineoxide photopolymerization initiator include 2,4,6-trimethylbenzoyl-diphenylphosphine oxide, bis(2,4,6-trimethylbenzoyl)-phenylphosphine oxide, and his (2,6-dimethoxybenzoyl)-2,4,4-trimethyl-pentylphosphine oxide. Examples of commercially available products of the above-mentioned initiator include Lucirin (Trademark) TPO, manufactured by BASF JAPAN LTD. and IRGACURE 819 manufactured by BASF JAPAN LTD.

The content of each of the α-aminoacetophenone photopolymerization initiator or acylphosphineoxide photopolymerization initiator to be used is preferably 0.01 to 15 parts by weight and particularly preferably 0.5 to 10 parts by weight, based on the alkali-soluble component (100 parts by weight). When the content is 0.01 parts by weight or more and 15 parts by weight or less, the coating film can be stably formed. At the same time, coating film properties such as chemical resistance can be maintained. In addition, the sufficient outgas reduction effect is obtained, and the constant light absorption is maintained at the surface of the solder resist coating film. Further, an excellent deep-part curing property is obtained.

Specific examples of the titanocene photopolymerization initiator include bis(cyclopentadienyl)-di-phenyl-titanium, bis(cyclopentadienyl)-di-chloro-titanium, bis(cyclopentadienyl)-bis(2,3,4,5,6-pentafluorophenyOtitanium and bis(cyclopentadienyl)-bis(2,6-difluoro-3-(pyrrol-1-yl)phenyl)titanium. Examples of the commercially available of the above-mentioned initiator include IRGACURE 784 manufactured by BASF JAPAN LTD.

The content of the titanocene photopolymerization initiator to be used is preferably 0.05 to 5 parts by weight and more preferably 0.05 to 3 parts by weight and particularly preferably 0.1 to 2 parts by weight, based on the alkali-soluble component (C) (100 parts by weight). When the content is 0.05 parts by weight or more and 5 parts by weight or less, the deep-part curing property is improved, and the possibility of causing a large halation is minimized.

Specific examples of the photopolymerization initiator having an acyloxyimino group include O,O'-succinic acid diacetophenone oxime, O,O'-succinic acid dinaphtophenoneoxime and benzophenoneoxime acrylate-styrene copolymer.

Specific examples of the photopolymerization initiator having a N-formylated aromatic amino group and a N-acylated aromatic amino group include di-N-(p-formylamino) diphenylmethane, di-N-(p-acethylamino)diphenylmethane, di-N-(p-benzoamide)diphenylmethane, 4-formylaminotoluylene, 4-acetylaminotoluylene, 2,4-diformylaminotoluylene, 1-formylaminonaphthalene, 1-acetylaminonaphthalene, 1,5-diformylaminonaphthalene, 1-formylaminoanthracene, 1,4-diformylaminoanthracene, 1-acetylaminoanthracene, 1,4-diformylaminoanthraquinone, 1,5-diformylaminoanthraquinone, 3,3'-dimethyl-4,4'-diformylaminobiphenyl, and 4,4'-diformylaminobenzophenone.

Examples of the photopolymerization initiator having a nitrobenzylcarbamate group and an alkoxybenzylcarbamate group include bis{{(2-nitrobenzyl)oxy}carbonyl} diamiodiphenylmethane, 2,4-di{{(2-nitrobenzyl)oxy}toluylene, bis{{(2-nitrobenzyloxy)carbonyl}hexane-1,6-diamine and m-xylidin{{(2-nitro-4-chlorobenzyl)oxy}amide}.

The photo-base generator (D-2) is a compound wherein the molecular structure is changed or the molecule is cleaved by photoirradiation such as UV rays and visible light. From this compound, at least one basic substance is formed, which is capable of serving as a catalyst for an addition reaction between a polyimide resin having a carboxyl group and a thermosetting component. Examples of the basic substance include secondary amine and tertiary amine.

Examples of the photo-base generator include an α-aminoacetophenone compound, an oxime ester compound and a compound having a substituent such as an acyloxyimino group, a N-formylated aromatic amino group, a N-acylated aromatic amino group, a nitrobenzylcarbamate group and an alkoxybenzylcarbamate group. Of them, an oxime ester compound and an α-aminoacetophenone compound are preferable. As the α-aminoacetophenone compound, a compound having two or more nitrogen atoms is of a particular preference.

Examples of other photo-base generators include WPBG-018 (trade name), which is 9-anthrylmethyl N,N'-diethylcarbamate, WPBG-027 (trade name), which is (E)-1-[3-(2-hydroxyphenyl)-2-propenoyl]piperidine, WPBG-082 (trade name), which is guanidinium 2-(3-benzoylphenyl)propionate and WPBG-140 (trade name), which is 1-(anthraquinon-2-yl) ethyl imidazolecarboxylate.

Examples of the photo-base generator (D-2) include a carbamate derivative and a quaternary ammonium salt. Some of the photopolymerization initiators (D-1) also serve as the photo-base generator (D-2), of which an oxime ester photopolymerization initiator having an oxime ester group, an α-aminoacetophenone photopolymerization initiator, an acylphosphineoxide photopolymerization initiator and a titanocene photopolymerization initiator are preferred. Furthermore, photopolymerization initiators having a substituent such as an acyloxyimino group, a N-formylated aromatic amino group, a N-acylated aromatic amino group, a nitrobenzyl carbamate group and an alkoxybenzylcarbamate group can also be used. Explanations on individual initiators are the same as in the photopolymerization initiator (D-1).
(Photopolymerization Initiator Aid or Sensitizer)

Examples of a photopolymerization initiator aid or a sensitizer include a benzoin compound, an acetophenone compound, an anthraquinone compound, a thioxanthone compound, a ketal compound, a benzophenone compound, a tertiary amine compound and a xanthone compound. These compounds can be used as the photopolymerization initiator (D-1) for some instances. On the other hand, the photopolymerization initiator aid or sensitizer are preferably used in combination with the photopolymerization initiator (D-1). Furthermore, the photopolymerization initiator aids or sensitizers may be used alone or in combination with two or more.

Examples of the benzoin compound include benzoin, benzoin methyl ether, benzoin ethyl ether and benzoin iso-propyl ether.

Examples of the acetophenone compound include acetophenone, 2,2-dimethoxy-2-phenylacetophenone, 2,2-diethoxy-2-phenylacetophenone and 1,1-dichloroacetophenone.

Examples of the anthraquinone compound include a 2-methylanthraquinone, 2-ethylanthraquinone, 2-t-butylanthraquinone and 1-chloroanthraquinone.

Examples of the thioxanthone compound include 2,4-dimethylthioxanthone, 2,4-diethylthioxanthone, 2-chlorothioxanthone and 2,4-diisopropylthioxanthone.

Examples of the ketal compound include acetophenonedimethyl ketal and benzyldimethyl ketal.

Examples of the benzophenone compound include benzophenone, 4-benzoyldiphenyl sulfide, 4-benzoyl-4'-methyldiphenyl sulfide, 4-benzoyl-4'-ethyldiphenyl sulfide and 4-benzoyl-4'-propyldiphenyl sulfide.

Examples of the tertiary amine compound include an ethanolamine compound and a compound having a dialkylamino benzene structure. Examples of the commercially available products thereof include dialkylaminobenzophenones such as 4,4'-dimethylaminobenzophenone (NISSOCURE (Trademark) MABP, manufactured by Nippon Soda Co., Ltd.) and 4,4'-diethylaminobenzophenone (EAB, manufactured by HODOGAYA CHEMICAL CO. LTD.); dialkylamino group-containing coumarin compounds such as 7-(diethylamino)-4-methyl-2H-1-benzopyran-2-one(7-(diethylamino)-4-methylcoumarin); ethyl 4-dimethylaminobenzoate (Kaya Cure (Trademark) EPA, manufactured by Nippon Kayaku Co., Ltd.), ethyl 2-dimethylaminobenzoate (Quantacure DMB, manufactured by International Biosynthetics Ltd.), (n-butoxy)ethyl 4-dimethylamino benzoate (Quantacure BEA, manufactured by International Biosynthetics Ltd.), isoamylethyl p-dimethylaminobenzoate (Kaya Cure DMBI, manufactured by Nippon Kayaku Co., Ltd.,) and 2-ethylhexyl 4-dimethylaminobenzoate (Esolol 507, manufactured by Van. Dyk & Co., Inc.). As the tertiary amine compound, a compound having a dialkylamino benzene structure is preferable. Of them, a dialkylamino benzophenone compound, a dialkylamino group-containing coumarin compound and keto-coumarin compound having a maximum absorption wavelength of 350 to 450 nm are particularly preferable.

As the dialkylamino benzophenone compound, 4,4'-diethylamino benzophenone is preferably used, because of the low toxicity. The dialkylamino group-containing coumarin compound is colored to a limited extent, since the compound has a maximum absorption wavelength in a UV range, i.e., from 350 to 410 nm. By use of the above-mentioned compound, a colorless or transparent photosensitive composition can be obtained, or a colored solder resist film which reflects the color of a further added pigment can be obtained. In particular, 7-(diethylamino)-4-methyl-2H-1-benzopyran-2-one is preferred, which has an excellent sensitization effect to laser light having a wavelength of 400 to 410 nm.

Of these, a thioxanthone compound and a tertiary amine compound are preferred. In particular, deep-part curing property can be improved, owing to the presence of a thioxanthone compound.

The content of the photopolymerization initiator aid or sensitizer to be used is preferably 0.1 to 20 parts by weight, based on the alkali-soluble component (C) (100 parts by weight). when the content of the photopolymerization initiator aid or sensitizer is less than 0.1 parts by weight, a sufficient sensitization effect tends not to be obtained. In contrast, when the content exceeds 20 parts by weight, light absorption by a tertiary amine compound on the surface of a coating film extremely is increased and deep-part curing property would be decreased. More preferably, the content of the photopolymerization initiator aid or sensitizer is 0.1 to 10 parts by weight, based on the alkali-soluble component (C) (100 parts by weight).

The total amount of the photopolymerization initiator, photopolymerization initiator aid and sensitizer is preferably 35 parts by weight or less, based on the alkali-soluble component (C) (100 parts by weight). When the content of exceeds 35 parts by weight, deep-part curing property tends to be decreased because of light absorption by the photopolymerization initiator, photopolymerization initiator aid and sensitizer.

The photopolymerization initiator, photopolymerization initiator aid and sensitizer sometimes serve as UV absorbers by absorbing lights having predetermined wavelengths, to give a low sensitivity, for some instances. However, the photopolymerization initiator, photopolymerization initiator aid and sensitizer are not used only for improving sensitivity of a composition. If appropriate, these materials are used for absorbing lights of predetermined wavelengths, to increase the photo reactivity on the surface of the resist, to change the lines and openings in the resist into straight, taper or inverted taper shapes, and also to improve processing accuracy of a line width and an opening diameter.

[Component E: Heat-Curing Catalyst (E)]

In the present invention, it is preferable to further use (E) a heat-curing catalyst. Examples of the heat-curing catalyst that can be used include imidazole derivatives such as imidazole, 2-methylimidazole, 2-ethylimidazole, 2-ethyl-4-methyl imidazole, 2-phenylimidazole, 4-phenylimidazole, 1-cyanoethyl-2-phenylimidazole and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine and 4-methyl-N,N-dimethylbenzylamine; hydradine compounds such as adipic dihydrazide and sebacic dihydrazide; and phosphorus compounds such as triphenylphosphine.

Examples of commercially available products of the above-mentioned catalyst include 2MZ-A, 2MZ-OK, 2PHZ, 2P4BHZ, 2P4MHZ (all are trade names of imidazole compounds) manufactured by Shikoku Chemicals Corp.; and U-CAT (Trademark) 3503N and U-CAT3502T (all are trade names of block isocyanate compounds of dimethylamine) and DBU, DBN, U-CATSA102 and U-CAT5002 (all are dicyclic amidine compounds and salts thereof) manufactured by San-Apro Ltd. The catalysts to be used in the present invention are not particularly limited to the above, and heat-curing catalysts for epoxy compounds and oxetane compounds, or any compound may be used, as long as the catalysts facilitate the reaction between an epoxy group and/or an oxetanyl group and a carboxyl group. The catalysts may be used alone or as a mixture of two or more.

Furthermore, guanamine, acetoguanamine, benzoguanamine, melamine and S-triazine derivatives such as 2,4-diamino-6-methacryloyloxyethyl-S-triazine, 2-vinyl-2,4-diamino-S-triazine, 2-vinyl-4,6-diamino-S-triazine/isocyanuric acid adduct and 2,4-diamino-6-methacryloyloxyethyl-S-triazine/isocyanuric acid adduct, can be used. Preferably, these compounds, which also serve as adhesiveness imparting agent, are used in combination with the heat-curing catalyst.

The content of the heat-curing catalyst is preferably 0.1 to 20 parts by weight, and more preferably 0.5 to 15.0 parts by weight, based on the thermosetting component (B) (100 parts by weight).

[Photosensitive Monomer]

The curable resin composition of the present invention may include a photosensitive monomer. In particular, it is preferable that the curable resin composition is a photosensitive curable resin composition, in view of curability and development resistance. The photosensitive monomer is a compound having an ethylenically unsaturated group in the molecule, which is used for controlling viscosity of the curable resin composition, accelerating curability, and improving developability. As the photosensitive monomer, polyester (meth)acrylate, polyether (meth)acrylate, urethane (meth)acrylate, carbonate (meth)acrylate, epoxy (meth)acrylate and urethane (meth)acrylate that are commonly known in the art, can be used. Specific examples of the photosensitive monomer include hydroxyalkyl acrylates such as 2-hydroxyethyl acrylate and 2-hydroxypropyl acrylate; diacrylates of glycols such as ethylene glycol, methoxytetraethylene glycol, polyethylene glycol and propylene glycol; acrylamides such as N,N-dimethylacrylamide, N-methylolacrylamide and N,N-dimethylaminopropylacryl amide; aminoalkyl acrylates such as N,N-dimethylaminoethyl acrylate and N,N-dimethylaminopropyl acrylate; polyfunctional acrylates of polyhydric alcohols such as hexane diol, trimethylolpropane, pentaerythritol, dipentaerythritol, or tris-hydroxyethyl isocyanurate, or ethylene oxide adducts, propylene oxide adducts or ε-caprolactone adducts of the above-mentioned polyhydric alcohol; polyfunctional acrylates such as phenoxyacrylate, bisphenol A diacrylate and ethylene oxide adducts or propylene oxide adducts of the above-mentioned phenols; and polyfunctional acrylates of glycidyl ethers such as glycerin diglycidyl ether, glycerin triglycidyl ether, trimethylolpropane triglycidyl ether and triglycidyl isocyanurate. Further, examples also includes acrylates and melamine acrylates obtained by direct acrylation or diisocyanate-mediated urethane acrylation of a polyol such as polyether polyol, polycarbonate diol, hydroxy group terminated polybutadiene or polyester polyol, and methacrylates corresponding to the aforementioned acrylates.

In addition, e.g., an epoxy acrylate resin, which is obtained by allowing multifuntional epoxy resins such as a cresol novolak-type epoxy resin to react with acrylic acid or an epoxy urethane acrylate compound which is obtained by allowing the hydroxyl group of the above-described epoxy acrylate resin to react with a hydroxyacrylate such as pentaerythritol triacrylate and a half urethane compound of diisocyanate such as isophorone diisocyanate can be used. Such epoxy acrylate resin helps to improve curability of the composition without reducing finger touch dryness of the resultant film.

The aforementioned compounds having an ethylenically unsaturated group in a molecule may be used alone or in combination with two or more.

The content of the aforementioned photosensitive monomer is preferably 5 to 100 parts by weight, based on the alkali-soluble component (C) (100 parts by weight). When the above-mentioned content is less than 1 part by weight, the curability of the resin composition is decreased, which sometimes makes it difficult to carry out a pattern formation by irradiation of an activation energy ray and the following alkali development. In contrast, when the content exceeds 100 parts by weight, the solubility of the resin composition with respect to a dilute aqueous alkaline solution is decreased and the coating film could be fragile. The preferable content of the photosensitive monomer is in the range of 5 to 70 parts by weight.

[Other Optional Components]

The curable resin composition of the present invention can further contain at least one of a chain transfer agent, an adhesion promoter, an antioxidant, a rust preventing agent, a polymerization inhibitor, a UV absorber, a thickener, a deforming agent and a leveling agent, and further components such as a silane coupling agent, a filler, a binder, a flame retardant, a thixotropy imparting agent and a rust preventing agent. As these, those known in the field of electronic materials can be used.

In the curable resin composition of the present invention, an organic solvent can be used, for controlling the aforementioned carboxyl group-containing resin or for controlling viscosity of the composition for applying it onto a substrate.

The curable resin composition of the present invention can be used in the form of a dry film containing a carrier film (substrate) and a layer prepared from the curable resin composition and provided on the carrier film.

The dry film is obtained by diluting the curable resin composition of the present invention with an organic solvent to an appropriate viscosity, applying the diluted composition to a carrier film to have a uniform thickness by means of a comma coater, a blade coater, a lip coater, a rod coater, a squeeze coater, a reverse coater, a transfer roll coater, a gravure coater or a spray coater, and drying the composition usually at a temperature of 50 to 130° C. for 1 to 30 minutes. The thickness of the coating film is not particularly limited. However, in general, the thickness of the composition film after dried is appropriately selected from the range of 5 to 150 μm, and preferably in the range of 10 to 60 μm.

As the carrier film, a plastic film is used. Preferable examples of the plastic film is a polyester film such as polyethylene terephthalate, a polyimide film, a polyamide-imide film, a polypropylene film and a polystyrene film. The thickness of the carrier film is not particularly limited. However, in general, the thickness of the carrier film is appropriately selected from the range of 10 to 150 μm.

After a film of the curable resin composition (composition film) of the present invention is formed on a carrier film, a detachable cover film is preferably laminated further on the surface of the film, for instance, for preventing dust deposition on the film surface.

As the detachable cover film, for example, a polyethylene film, a polytetrafluoroethylene film, a polypropylene film and a paper whose surface has been treated, can be used. Any cover film may be used as long as the adhesion between the composition film and the cover film is smaller than that between the composition film and the carrier film when the cover film is removed.

The curable resin composition of the present invention is diluted, for example, with an organic solvent, to formulate a diluted composition having viscosities suitable for coating methods to be used. Such diluted composition is applied to a substrate by e.g., a dip coat method, a flow coat method, a roll coat method, a bar coater method, a screen printing method or a curtain coat method. The organic solvent contained in the composition is vaporized/dried (preliminary drying) at a temperature of about 60 to 100° C. to form a tack-free coating film. Alternatively, the above composition may be applied to a carrier film, dried to have a film which is then rolled up. The rolled up dry film is adhered to the substrate with the curable resin composition being contact with the substrate by using a laminator or the like, followed by the carrier film being removed. Accordingly, a resin insulation layer is formed.

The curable resin composition of the present invention can be appropriately used as resists for forming pattern layers of printed circuit boards or insulating materials. Of them, the curable resin composition is particularly useful as a solder resist or a material for an interlayer insulation/dielectric layer.

The curable resin composition of the present invention can be patterned and cured by performing screen printing or applying a pattern-wise light to the substrate.

In the process for forming a pattern by the curable resin composition of the present invention, a negative pattern is formed by a step (a) of applying a curable resin composition to a substrate, a step (b) of applying a pattern-wise light to the curable resin composition to activate a photopolymerization initiator to cure the photo-irradiated part, and a step (c) of removing the non-irradiated part, which is a part of the curable resin composition except for the photo-irradiated part, by development to form a negative-type patterned layer.

[Step (a): Step of Forming a Composition Layer]

The above step (a) is a step of forming a composition layer from a curable resin composition, on a substrate. The composition layer is formed by a method of applying a liquid-state curable resin composition to a substrate and drying the composition. The composition layer may be prepared as a dry film, which can be then laminated to a substrate.

As the method of applying the curable resin composition the substrate, a method using a coater such as a blade coater, a lip coater, a comma coater and a film coater and known in the art can be appropriately employed. In the drying method, equipments with a heat source of vapor-used heating system, such as a hot-air circulation type drying furnace, an IR furnace, a hot plate, and a convection oven can be used. Further, a method known in the art can be used, for instance, a method wherein a hot air countercurrent contact is carried out in a dryer or a method of spraying hot air from a nozzle to a support.

Examples of the substrate include a printed wiring substrate and a flexible printed wiring substrate in which a circuit is previously formed, and all grade (FR-4 etc.) copper clad laminate layers using a composite material such as paper-phenolic resin, paper-epoxy resin, glass fabric-epoxy resin, glass fabric-polyimide, glass fabric/non-woven cloth-epoxy resin, glass fabric/paper-epoxy resin, synthetic fiber-epoxy resin, fluorine resin/polyethylene/polyphenylene ether and polyphenylene oxide/cyanate ester, polyimide films, PET films, glass substrates, ceramic substrates and wafer substrates.

Drying by volatilization, which is to be performed after coating the curable resin composition of the present invention, can be carried out by use of a hot-air circulation type drying furnace, an IR furnace, a hot plate or a convection oven (a method wherein a hot air countercurrent contact is carried out in a dryer or a method of spraying hot air from a nozzle to a support).

[Step (b): Curing Step]

In the step (b), patterning is performed by applying light (photoirradiation with an activation energy ray, particularly, UV rays etc.) to the coating film, which has been subjected to volatilization and drying of a solvent after the above step (a). In an embodiment (b-1), a photopolymerization initiator in a curable resin composition serves to initiate a sequential reaction of ethylenically unsaturated double bonds to cure a photo-irradiated part (part irradiated with light such as an activation energy ray, particularly UV rays). In this embodiment, a negative pattern formation, which is stable with respect to the following alkali development solution can be formed. In addition, the composition has an improved curing properties, when the thermal curing is simultaneously carried out. Thus, the present embodiment is preferable.

In the above-mentioned embodiment, selective light application is carried out through a photomask in the form of a predetermined pattern, in accordance with a contact system (or non-contact system). Alternatively, a pattern-wise light application is carried out directly by use of a direct-drawing apparatus. Accordingly, the photo-base generating component contained in a curable resin composition generates bases, at the irradiated part, thereby curing the photo-irradiated part, In another embodiment (b-2), the photopolymerization initiator contained in a curable resin composition is activated by negative pattern-wise photoirradiation to cure a photo-irradiated part. In this case bases are generated in the photo-irradiated part and destabilize the photopolymerization initiator to further generate and increase bases. As a result, the photo-irradiated part is sufficiently cured in a depth direction.

As a light irradiator for photoirradiation, the followings can be used: a direct drawing apparatus (for example, a laser direct imaging apparatus for directly drawing images by a laser based on CAD data from a computer), a light irradiator having a metal halide lamp installed therein, a light irradiator having an (ultra) high pressure mercury lamp installed therein, a light irradiator having a mercury short ark lamp installed therein, or a direct drawing apparatus having a UV lamp such as an (ultra) high pressure mercury lamp and a direct drawing apparatus using LED.

As the activation energy ray, a laser light or scattered light having a maximum wavelength within the range of 350 to 410 nm is preferably used. When the maximum wavelength falls within the above-mentioned range, the photo reactivity of a curable resin composition can be efficiently improved. As long as the maximum wavelength of laser light falls within the above-mentioned range, either one of a gas laser and a solid state laser may be used. Furthermore, the amount of photoirradiation can be generally set within the range of 100 to 1500 mJ/cm², and preferably in the range of 300 to 1500 mJ/cm², depending upon the film thickness or the like.

Herein, a negative type mask can be used as the mask for the pattern-wise light application.

In the step (b), a photopolymerization initiator contained in a curable resin composition is activated to cure a photo-irradiated part in the embodiment (b-2), i.e., in accordance with negative pattern-wise light application. In this case, bases are generated in the photo-irradiated part and destabilize the photopolymerization initiator, which further generates and increases bases, and hence the photo-irradiated part is sufficiently cured in a depth direction. In this case, it is preferable that heat application is further carried out to cure the photo-irradiated part (PEB: Post Exposure Bake). By the heat application, the bases generated in the step (b) reacts with the thermosetting component (addition reaction) the curable resin composition is sufficiently cured in a depth direction.

When openings having a small diameter such as 50 µm are to be prepared in the resin composition at the patterning, PEB treatment can be omitted for obtaining satisfactory resolution without having halation and undercut in the openings.

The heat application temperature is preferably a temperature, at which the photo-irradiated part of a curable resin composition is thermally cured, but the non-irradiated part is not thermally cured.

For example, the above-mentioned heat application is performed preferably at a temperature, which is lower than the exothermic onset temperature or exothermic peak temperature of the curable resin composition which has not been exposed to light irradiation (non-irradiated part), and higher than the exothermic onset temperature or exothermic peak temperature of the curable resin composition which has been exposed to light irradiation (photo-irradiated part). When heat application is performed as discussed above, only the photo-irradiated part can be selectively cured.

The heat application temperature herein is, for example, 40 to 140° C. and preferably 60 to 120° C. When the heat application temperature is 40° C. or more, the photo-irradiated part can be sufficiently cured. Further, when the heat application temperature is 140° C. or less, only the photo-irradiated part can be selectively cured. Moreover, the heat application period is, for example, 1 to 120 minutes, and preferably 10 to 80 minutes. The heat application method is the same as the described above for drying method.

In the non-irradiated part, no bases are generated from the photopolymerization initiator, and hence the thermal curing is suppressed.

In the present invention, as described in the above, the thermoplastic resin (A) has two or more glass transition points wherein $Tg_y < 0°$ C. and $Tg_x > 30°$, and the thermosetting component (B) has a glass transition point $Tg_z \geq Tg_y + 20°$ C. Accordingly, the phase separation of components or segments proceeds in the course of the curing of the composition. Consequently, a composition film having all over sea-island pattern is formed.

Due to the sea-island structure of the cured product of a resin composition, a pattern having excellent elasticity and toughness can be obtained. When the thermal curing is performed at a temperature of $Tg_x$ or more of the hard segment, a micro sea-island structure of the resin composition is formed to obtain a cured product having excellent toughness.

The presence or absence of the sea-island structure can be confirmed by observing the surface or section of the cured product of the resin composition through an electron microscope (SEM, TEM, STEM) and a field emission scanning electron microscope (FE-SEM). By the observation, the diameters of "islands" derived from a soft segment can be found to be 1 µm or less, preferably 500 nm or less, and further preferably 50 nm or less. In this case, toughness or elongation rate of the cured product improves.

[Step (c): Development Step]

The step (c) is a step for forming a negative-type patterned layer by removing non-irradiated part by development. As the development method, a method known in the art such as a dipping method, a shower method, a spray method and a brush method, can be used. As the developer, potassium hydroxide, sodium hydroxide, sodium carbonate, potassium carbonate, sodium phosphate, sodium silicate, ammonia, an amine such as ethanolamine, an aqueous alkaline solution such as an aqueous tetramethylammonium hydroxide solution (TMAH) or a solution mixture of these can be used.

With the effect to environment taken into consideration, it is preferable that the resin composition of the present invention can be developed with a developer having pH less than 12.

[Step (d)]

In the aforementioned pattern formation method, the step (c) is preferably followed by a further photoirradiation step (d). Furthermore, when photoirradiation with UV rays etc. is performed after the step (c), the monomers remained without being reacted during light exposure, can be reacted. Wavelength of irradiation light and an amount of irradiation (amount of light exposure) in the photoirradiation step (d) may be the same with or different from those in the step (b). An amount of irradiation (amount of light exposure) is preferably 150 to 2000 $mJ/cm^2$.

[Step (e)]

In the aforementioned pattern formation method, the step (c) is preferably followed by thermal curing/thermosetting (post cure) step (e).

When both step (d) and step (e) are performed after the step (c), it is preferable that step (e) is performed after step (d).

In the step (e), thermal curing of a pattern layer is sufficiently performed with bases generated from a photopolymerization initiator only in step (b), or both step (b) and step (d). Since a non-irradiated part has already been removed by the initiation of step (e), the step (e) can be performed at a curing reaction initiation temperature or more of the non-irradiated curable resin composition/part. Accordingly, the patterned layer can be sufficiently cured by the heat application. The heat application temperature is, for example, 150° C. or more.

EXAMPLES

The present invention will now be explained more in detail by way of Examples below. However, the present invention is not limited to these Examples. In the Examples, the units "parts" and "%" are based on weight unless otherwise specified.

Examples 1 to 13 and Comparative Examples 1 to 8

Preparation of Curable Resin Composition

In accordance with the formulations described in the following Table 1 and Table 2, materials described in each of Examples were blended, preliminary mixed by a stirrer and kneaded by a triplet roll mill to prepare a curable resin composition.

<1. Toughness>

1-1. Formation of Substrate to be Evaluated

The curable resin compositions of Examples 1 to 13 and Comparative Examples 1 to 8 obtained above were each applied on the entire surface of a copper foil substrate having a pattern formed thereon, by screen printing so as to obtain a dry film having a thickness of about 40 μm (The obtained samples referred to as non-cured samples 1 to 13 and comparative non-cured samples 1 to 8, respectively).

Each of the samples was dried at 80° C. for 30 minutes and allowed to cool to room temperature. Each of the curable resin compositions was exposed to light at an optimum exposure amount (1000 $mJ/cm^2$) by HMW680GW (metal halide lamp, scattered light) manufactured by ORC MANUFACTURING CO., LTD. to obtain a solder resist pattern. An aqueous solution of 1 wt. % sodium carbonate was sprayed at a spray pressure of 0.2 MPa at 30° C. for 120 seconds to perform development. In this manner, resist patterns were obtained.

The resultant substrate was irradiated with UV rays in a UV conveyor furnace at an integral light of 1000 $mJ/cm^2$, and heated under each of the conditions: (1) 160° C.×60 minutes, (2) 180° C.×60 minutes to cure.

1-2. Evaluation of Toughness

The substrate for evaluation obtained in the above was cut into strip pieces of 80 mm×10 mm and used as test pieces. Elongation (rate) at break was determined by a tension tester (model name: AGS-G 100N manufactured by Shimadzu Corporation) and was evaluated based on the following criteria:

◎ . . . elongation at break was 8% or more
○ . . . elongation at break was 5% or more and less than 8%
Δ . . . elongation at break was 3% or more and less than 5%
x . . . elongation at break was less than 3%

<2. Patterning Test>

Non-cured samples 1 to 13 and comparative non-cured samples 1 to 8 were irradiated with light by use of HMW680GW (metal halide lamp, scattered light) manufactured by ORC MANUFACTURING CO., LTD. at an integral light of 1000 $mJ/cm^2$ to obtain a negative pattern (The obtained samples are referred to as photoirradiation samples 1 to 13 and comparative photoirradiation samples 1 to 8, respectively).

The photoirradiation samples 1 to 7 and comparative photoirradiation samples 1 to 4 were heated in a heating furnace at 90° C. for 40 minutes (PEB) (The resultant samples are referred to as photoirradiation/PEB samples 1 to 7 and comparative photoirradiation/PEB samples 1 to 4, respectively).

Thereafter, photoirradiation/PEB samples 1 to 7, comparative photoirradiation/PEB samples 1 to 4, photoirradiation samples 8 to 13 and comparative photoirradiation samples 5 to 8 were soaked in a 3 wt % TMAH/5 wt. % ethanol amine mixed solution at 35° C. for 3 minutes to perform development.

Separately from the above, photoirradiation/PEB samples 1 to 7, comparative photoirradiation/PEB samples 1 to 4, photoirradiation samples 8 to 13, and comparative photoirradiation samples 5 to 8 were immersed in an aqueous solution of 1.0 wt. % sodium carbonate (severe development conditions) for 3 minutes to perform development.

Evaluation criteria of patterning are as follows:

◎ . . . Development was possible even in the aqueous solution of 1.0 wt. % sodium carbonate, in place of a TMAH/ethanolamine mixed solution. No damage by a developer was observed on the surface of a photo-irradiated part and no development residue was observed in a non-irradiated part.

○ . . . No damage by a TMAH/ethanolamine mixed solution used as a developer was observed on the surface of a photo-irradiated part, and no development residue was observed in a non-irradiated part.

x . . . Damage by a TMAH/ethanolamine mixed solution used as a developer was observed on the surface of a photo-irradiated part, development residue was observed in a non-irradiated part, a development of non-irradiated part could not be performed, or both photo-irradiated part and non-irradiated part were completely dissolved.

<3. Opening Diameter>

In the above patterning test, openings having a size (diameter) of 50 μm and 100 μM were visually inspected and the state of the openings were evaluated. An aqueous solution of 1.0 wt. % was used as a developer.

◎ ... Openings having a diameter of 50 μm or less were in an excellent state

○ ... Openings having a diameter of 100 μM or less and more than 50 μm were in an excellent state, but openings having a diameter of 50 μm or less were in an unsatisfactory state (halation and undercut observed)

x ... Openings having a diameter of 100 μm or less were in an unsatisfactory state (halation and undercut observed)

<4. Confirmation of Nanocylinder Structure>

Samples cured in the conditions employed in the above patterning test were broken by a tension tester (model name: AGS-G 100N manufactured by Shimadzu Corporation) and sections of the broken samples were observed by FE-SEM (JEOL).

The structures of nanocylinders observed at this time were evaluated based on the following criteria:

○ ... Nanocylinder structure having a diameter 0.1 nm to 1 μm was formed.

x ... Macro-phase (diameter 1 μm or more) separation or uniform system was observed.

The obtained results are shown in the following Tables 1 and 2.

Figure 1:
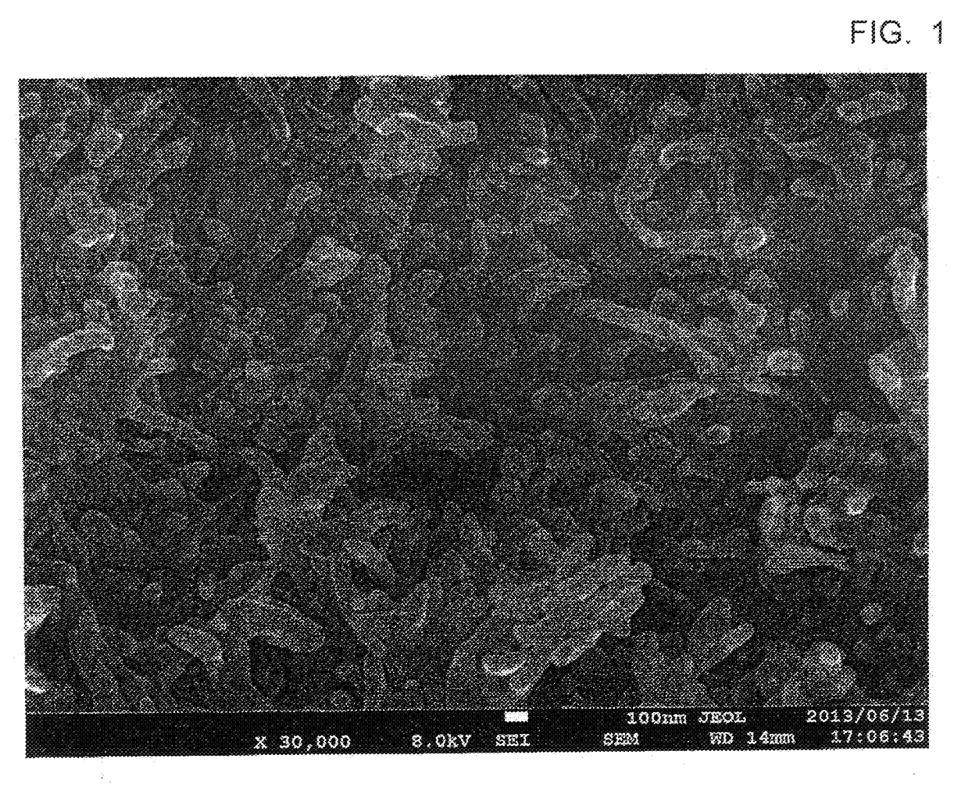
FIG. 1 is a scanning electron micrograph (SEM) showing a nanocylinder structure in a cured product obtained from a curable resin composition according to Example 1 of the present invention.
Figure 2:
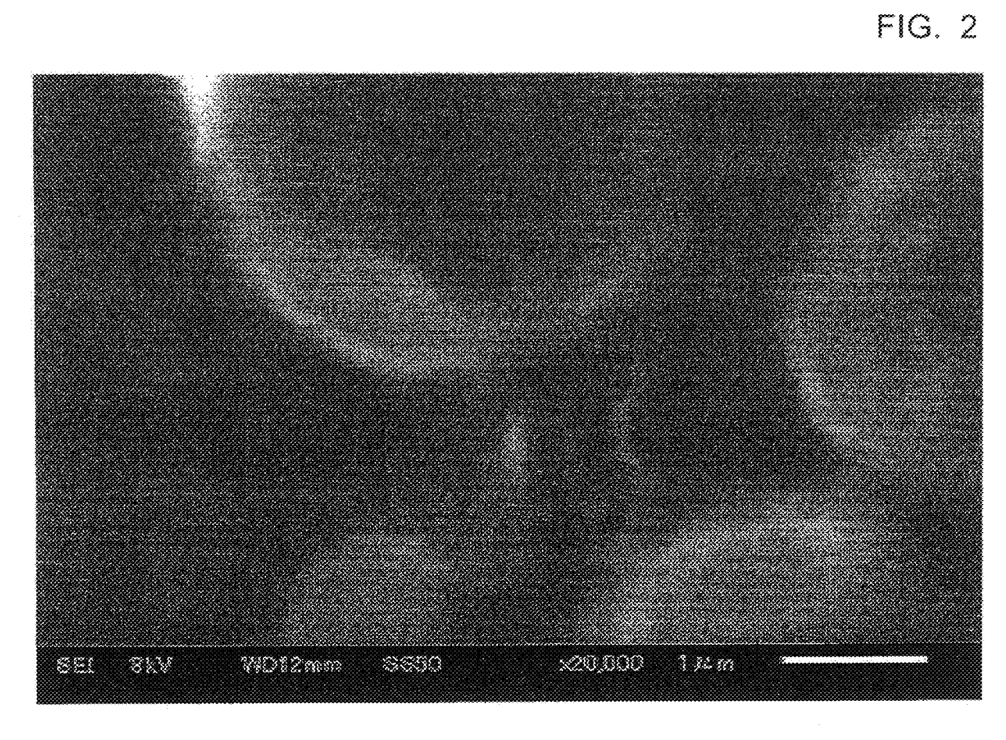
FIG. 2 is a scanning electron micrograph (SEM) showing a macrophase separated structure in a cured product obtained from a curable resin composition according to Comparative Example 2.
Figure 3:
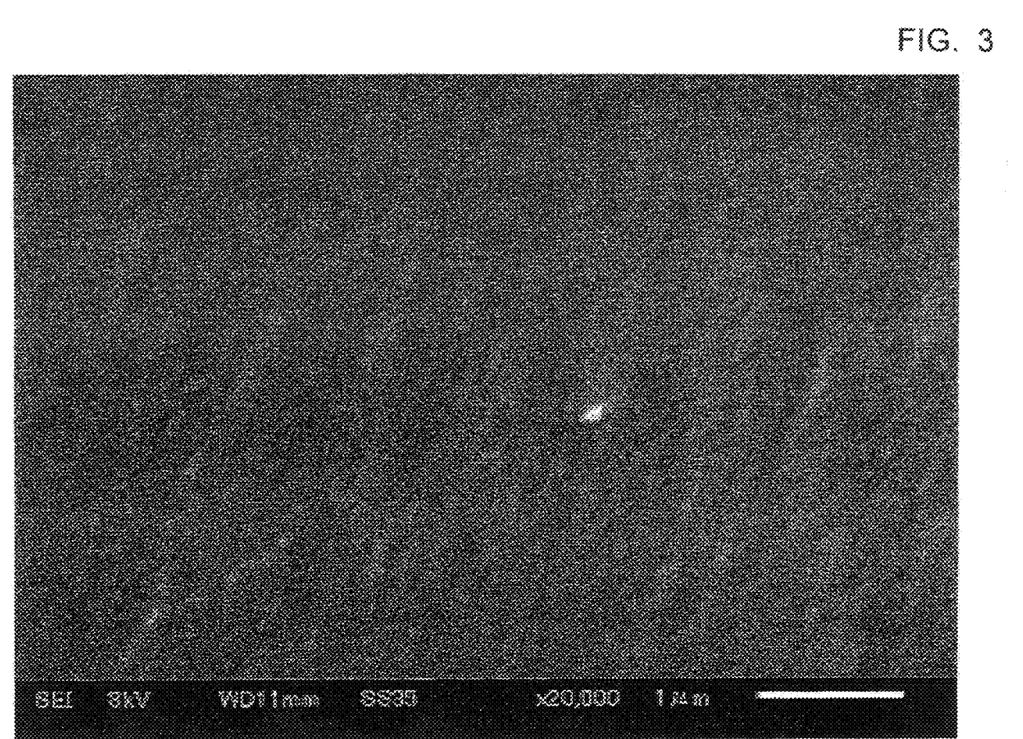
FIG. 3 is a scanning electron micrograph (SEM) showing a uniform structure in a cured product obtained from a curable resin composition according to Comparative Example 4 of the present invention.

Electron microscope photographs of sample sections of Example 1, Comparative Examples 2 and 4 are further shown in FIG. 1 to FIG. 3.

TABLE 1

(PEB treatment was applied)

| | Example 1 | Example 2 | Example 3 | Example 4 | Example 5 | Example 6 | Example 7 | Comparative Example 1 | Comparative Example 2 | Comparative Example 3 | Comparative Example 4 |
|---|---|---|---|---|---|---|---|---|---|---|---|
| Thermoplastic resin LA2250 | 20 | | 20 | | | | | 20 | 20 | 20 | |
| Thermoplastic resin NanoStrengthM52N | | 20 | | 20 | 20 | 20 | 20 | | | | |
| Epoxy resin EPPN501HDA80 | | | 50 | | | | | | | | |
| Epoxy resin jER828 | 50 | 50 | | 50 | 50 | 50 | 50 | | 50 | 50 | 50 |
| Epoxy resin AER-900 | | | | | | | | 50 | | | |
| Phenolic resin HF1H60 | 46 | 46 | 46 | | | | | 46 | | 46 | 46 |
| Carboxyl group-containing resin Joncryl 586H60 | | | | 183 | | | | | | | |
| Carboxyl group-containing acrylate resin "Vernish A" | | | | | 153 | 153 | 153 | | | | |
| Photo-base generator WPBG-082 | | | | | | | 3 | | | | |
| Agent serving as photo-base generator and photopolymerization initiator IrgOXE02 | 3 | 3 | 3 | 3 | 3 | | | 3 | 3 | | 3 |
| Photopolymerization initiator TPO | | | | | | | 5 | | | | |
| Heat-curing catalyst 2E4MZ | | | | | | | | 1 | | 3 | |
| Tg-Tg difference | 20 | 20 | 60 | 20 | 20 | 20 | 20 | -10 | 20 | 20 | 20 |
| Phase structure | Nano | Nano | Nano | Nano | Nano | Nano | Nano | Macro | Macro | Macro | Uniform |
| Patterning | ○ | ○ | ○ | ◎ | ◎ | ◎ | ◎ | ○ | ○ | x | ○ |
| Opening diameter | ○ | ○ | ○ | ○ | ◎ | ○ | ○ | ○ | ○ | • | ○ |
| Strength | ◎ | ◎ | ◎ | ◎ | ○ | ○ | ○ | x | x | x | Δ |
| Confirmation of nanocylinder structure | ○ | ○ | ○ | ○ | ○ | ○ | ○ | x | x | x | x |

TABLE 2

(PEB treatment was not applied)

| | Example 8 | Example 9 | Example 10 | Example 11 | Example 12 | Example 13 | Comparative Example 5 | Comparative Example 6 | Comparative Example 7 | Comparative Example 8 |
|---|---|---|---|---|---|---|---|---|---|---|
| Thermoplastic resin LA2250 | | | 20 | | | | | | | |
| Thermoplastic resin NanoStrengthM52N | 20 | 20 | | 20 | 20 | 20 | 20 | 20 | 20 | |
| Epoxy resin EPPN501HDA80 | | 50 | | | | | | | | |
| Epoxy resin jER828 | 50 | | 50 | 50 | 50 | 50 | | 50 | 50 | 50 |
| Epoxy resin AER-900 | | | | | | | 50 | | | |
| Phenolic resin HF1H60 | | | 37 | | | | | | | |
| Carboxyl group-containing resin Joncryl 586H60 | | | | 183 | | | | | | |
| Carboxyl group-containing acrylate resin "Vernish A" | 153 | 153 | | | 153 | 153 | 153 | 153 | | 153 |
| Photo-base generator WPBG-082 | | | | | | | | | | |
| Agent serving as photo-base generator and photopolymerization initiator IrgOXE02 | 3 | 3 | | | 3 | | 3 | 3 | | 3 |
| Photopolymerization initiator TPO | | | | | | 5 | | | | |
| Heat-curing catalyst 2E4MZ | | | | | | 1 | | | 3 | |
| Photopolymerizable monomer DHPA | 5 | 5 | 10 | 10 | 5 | 5 | 5 | 5 | 5 | 5 |
| Tg-Tg difference | 20 | 60 | 20 | 20 | 20 | 20 | −10 | 20 | 20 | 20 |
| Phase structure | Nano | Nano | Nano | Nano | Nano | Nano | Macro | Macro | Macro | Uniform |
| Patterning | ◎ | ◎ | ○ | ◎ | ◎ | ◎ | ◎ | ◎ | x | ◎ |
| Opening diameter | ◎ | ◎ | ◎ | ◎ | ◎ | ◎ | ◎ | ◎ | • | ◎ |
| Strength | ○ | ○ | ◎ | ○ | ○ | ○ | x | x | x | Δ |
| Confirmation of nanocylinder structure | ○ | ○ | ○ | ○ | ○ | ○ | x | x | x | x |

Materials listed in Tables 1 and 2 are as follows:

LA2250 . . . manufactured by Kuraray Co., Ltd.

NanoStrengthM52N . . . manufactured by Arkema K.K.

EPPN501H . . . manufactured by Nippon Kayaku Co., Ltd.

jER828 . . . manufactured by Mitsubishi Chemical Corporation

AER-900 . . . manufactured by Asahi Kasei E-Materials Corporation

HF1H60 . . . manufactured by MEIWA PLASTIC INDUSTRIES, LTD.

Joncryl 586H60 . . . manufactured by JOHNSON POLYMER

WPBG-082 . . . manufactured by Wako Pure Chemical Industries Ltd.

IrgOXE02 . . . manufactured by BASF JAPAN LTD.

TPO . . . manufactured by BASF JAPAN LTD.

2E4MZ . . . manufactured by Shikoku Chemicals Corp.

DHPA . . . manufactured by Nippon Kayaku Co., Ltd.

<Synthesis of Carboxylic Group-Containing Resin: "Vernish A">

Vernish A (carboxylic group-containing resin (A)) was prepared in accordance with the following synthesis example:

210 parts of cresol novolac epoxy resin "EPICLON" (Trademark) N-680 (manufactured by DIC Corporation; epoxy equivalence: 210) was introduced into a four neck flask equipped with a stirrer and a condenser, and dissolved after the addition of 96.4 parts of carbitol acetate thereto and subsequent heat application thereto. Subsequently, 0.46 parts of hydroquinone as a polymerization inhibitor, and 1.38 parts of triphenylphosphine as a catralyst were added to to the flask. The resultant mixture was heated to a temperature in the range of 95 to 105° C., and 72 parts of acrylic acid were gradually added to the mixture, in a dropwise manner. The mixture was subjected to a reaction was for about 16 hours until the acid value of 3.0 mgKOH/g or less was observed. The thus obtained reaction product was cooled to a temperature in the range of 80 to 90° C. Further, 76 parts of Tetrahydrophthalic anhydride were added to the product, and the mixture was allowed to a further reaction for 8 hours, and then cooled. The thus obtained reaction solution (referred to as "varnish A") was taken out of the flask. The resultant photosensitive resin had an acid value of 78 mgKOH/g (solid content) and non-volatile content of 65%.

It is found that Samples 1 to 13 obtained from the resin composition of the present invention can be developed with alkali and have extremely excellent toughness, compared to Comparative samples. In addition, a nanocylinder structure was observed in any one of the cured products of the resin compositions. In contrast, a nanocylinder structure was not observed in the cured products of Comparative Examples. This suggests that excellent strength provided by the resin composition may be due to improvement in toughness of a cured product.

Even if a resin is cured by any one of a photo-base generator, an agent serving as both a photo-base generator and a photopolymerization initiator and a heat-curing catalyst, when a PEB treatment is not applied, the states of openings were satisfactory.

According to the present invention, a curable resin composition is provided, which can be cured into a product having an excellent strength against tearing, breaking, distortion, and torsion, and an excellent toughness. Moreover, the cured product of the present invention rarely has cracks are, and even if cracks are formed, the propagation of cracks will be restricted. Accordingly, the curable resin composition, when used as a resist, exerts excellent function to a maximum extent. Moreover, the curable resin composition of the present invention can be developed with an alkali developer.

The present invention being thus described, it will be clearly understood that the same may be varied in many ways. Such variations are not to be regarded as a departure from the spirit and scope of the present invention, and all such modification as would be easily understood to one skilled in the art are intended to be included within the scope of the appended claims.

The invention claimed is:

1. A curable resin composition comprising:
   (A) a thermoplastic resin,
   (B) a thermosetting component,
   (C) an alkali-soluble component, and
   at least one compound selected from the group consisting of (D-1) a photopolymerization initiator and (D-2) a photo-base generator,
   wherein
   the thermoplastic resin (A) has two or more glass transition points including two glass transition points $T_{gx}$ and $T_{gy}$, which satisfy $T_{gx}>30°$ C. and $T_{gy}<0°$ C. and
   the thermosetting component (B) has a glass transition point $T_{gz}$, which satisfies $T_{gz} \geq T_{gy}+20°$ C.

2. The curable resin composition according to claim 1, wherein a cured product obtained by curing the curable resin composition includes a nanocylinder structure therein.

3. The curable resin composition according to claim 1, wherein the thermosetting component (B) is an epoxy compound.

4. The curable resin composition according to claim 1, wherein the alkali-soluble component (C) is a carboxyl group-containing resin or a phenolic hydroxy group-containing resin.

5. The curable resin composition according to claim 1, further comprising a heat-curing catalyst (E).

6. A cured product obtained by photoirradiation and subsequent thermal curing of the curable resin composition according to claim 1.

7. The cured product according to claim 6, wherein the cured product has a nanocylinder structure.

8. A printed circuit board comprising the cured product according to claim 6.

9. A process for manufacturing a cured product of a curable resin composition, comprising:
   (a) coating a substrate with the curable resin composition according to claim 1 and drying the curable resin composition,
   (b) applying a pattern-wise light to the curable resin composition to activate a photopolymerization initiator included in the curable resin composition to cure the photo-irradiated part, and
   (c) removing a non-irradiated part by development to form a negative-type patterned layer.

10. The process for manufacturing a cured product of a curable resin composition according to claim 9, further comprising (d) further light application.

11. The curable resin composition according to claim 1, comprising (D-1) the photopolymerization initiator.

12. The curable resin composition according to claim 1, comprising (D-2) the photo-base generator.

13. The curable resin composition according to claim 1, comprising both (D-1) the photopolymerization initiator and (D-2) the photo-base generator.

* * * * *